United States Patent
Murakami et al.

(10) Patent No.: US 9,847,793 B2
(45) Date of Patent: Dec. 19, 2017

(54) RECEPTION APPARATUS AND RECEPTION METHOD

(71) Applicant: PANASONIC INTELLECTUAL PROPERTY CORPORATION OF AMERICA, Torrance (CA)

(72) Inventors: Yutaka Murakami, Kanagawa (JP); Kiyotaka Kobayashi, Kanagawa (JP); Choo Eng Yap, Singapore (SG)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 49 days.

(21) Appl. No.: 14/968,350

(22) Filed: Dec. 14, 2015

(65) Prior Publication Data

US 2016/0099725 A1    Apr. 7, 2016

Related U.S. Application Data

(63) Continuation of application No. 14/244,579, filed on Apr. 3, 2014, now Pat. No. 9,246,518, which is a (Continued)

(30) Foreign Application Priority Data

Nov. 25, 2004  (JP) .................................. 2004-340371

(51) Int. Cl.
*H03M 13/00*   (2006.01)
*H03M 13/11*   (2006.01)
(Continued)

(52) U.S. Cl.
CPC .... *H03M 13/1105* (2013.01); *H03M 13/1102* (2013.01); *H03M 13/1157* (2013.01);
(Continued)

(58) Field of Classification Search
None
See application file for complete search history.

(56) References Cited

U.S. PATENT DOCUMENTS

| 5,867,538 A | 2/1999 | Liu |
| 5,974,101 A | 10/1999 | Nago |

(Continued)

FOREIGN PATENT DOCUMENTS

| JP | 11-55206 | 2/1999 |
| JP | 2003-304216 | 10/2003 |

(Continued)

OTHER PUBLICATIONS

International Search Report dated Feb. 21, 2006.
(Continued)

*Primary Examiner* — M. Mujtaba Chaudry
(74) *Attorney, Agent, or Firm* — Dickinson Wright

(57) ABSTRACT

In a multi-antenna communication system using LDPC codes, a simple method is used to effectively improve the received quality by performing a retransmittal of less data without restricting applicable LDPC codes. In a case of a non-retransmittal, a multi-antenna transmitting apparatus transmits, from two antennas, LDPC encoded data formed by LDPC encoding blocks. In a case of a retransmittal, the multi-antenna transmitting apparatus uses a transmission method, in which the diversity gain is higher than in the previous transmission, to transmit only a part of the LDPC encoded data as previously transmitted. For example, the only the part of the LDPC encoded data to be re-transmitted is transmitted from the single antenna.

6 Claims, 13 Drawing Sheets

Related U.S. Application Data continuation of application No. 13/566,694, filed on Aug. 3, 2012, now Pat. No. 8,732,547, which is a continuation of application No. 11/720,046, filed as application No. PCT/JP2005/021154 on Nov. 17, 2005, now Pat. No. 8,261,150.

(51) Int. Cl.

| | | |
|---|---|---|
| *H04B 7/0413* | (2017.01) | |
| *H04L 1/00* | (2006.01) | |
| *H04L 1/06* | (2006.01) | |
| *H04L 1/18* | (2006.01) | |
| *H04L 5/00* | (2006.01) | |
| *H03M 13/29* | (2006.01) | |

(52) U.S. Cl.
 CPC ... *H03M 13/1177* (2013.01); *H03M 13/2909* (2013.01); *H04B 7/0413* (2013.01); *H04L 1/0045* (2013.01); *H04L 1/0057* (2013.01); *H04L 1/0061* (2013.01); *H04L 1/06* (2013.01); *H04L 1/1816* (2013.01); *H04L 1/1893* (2013.01); *H04L 5/0023* (2013.01); *H04L 5/0044* (2013.01); *H03M 13/1174* (2013.01); *H04L 5/0037* (2013.01)

(56) References Cited

U.S. PATENT DOCUMENTS

| | | | |
|---|---|---|---|
| 6,230,021 | B1 | 5/2001 | Ohdachi |
| 6,665,348 | B1* | 12/2003 | Feher .................. H04L 7/0008 375/130 |
| 7,155,236 | B2 | 12/2006 | Chen |
| 7,397,864 | B2* | 7/2008 | Tarokh ................ H04L 1/0625 375/267 |
| 2002/0159431 | A1 | 10/2002 | Moulsley |
| 2003/0118031 | A1 | 6/2003 | Classon |
| 2003/0228885 | A1* | 12/2003 | Hattori ................. H04W 52/50 455/556.1 |
| 2004/0057530 | A1 | 3/2004 | Tarokh |
| 2004/0081073 | A1 | 4/2004 | Walton |
| 2004/0093549 | A1* | 5/2004 | Song .................. H03M 13/1111 714/752 |
| 2004/0123229 | A1* | 6/2004 | Kim ..................... H03M 13/09 714/800 |
| 2004/0162083 | A1* | 8/2004 | Chen .................. H04W 52/286 455/454 |
| 2004/0199846 | A1* | 10/2004 | Matsumoto ........... H03M 13/27 714/748 |
| 2004/0233838 | A1 | 11/2004 | Sudo |
| 2005/0255805 | A1 | 11/2005 | Hottinen |
| 2006/0062140 | A1 | 3/2006 | Sudo |
| 2006/0242530 | A1 | 10/2006 | Lu |
| 2007/0038912 | A1 | 2/2007 | Hashimoto |

FOREIGN PATENT DOCUMENTS

| | | |
|---|---|---|
| JP | 2004-40232 | 2/2004 |
| JP | 2004-112471 | 4/2004 |
| JP | 2004-187226 | 7/2004 |
| JP | 2004-520750 | 7/2004 |
| WO | 03/096150 | 11/2003 |
| WO | 03/101029 | 12/2003 |
| WO | 2004/038987 | 5/2004 |

OTHER PUBLICATIONS

J. Hagenauer, "Rate-Compatible Punctured Convolutional Codes (RCPC Codes) and their Applications," IEEE Transactions on Communications, vol. 36, No. 4, pp. 389-400, Apr. 1998.

S. Kallel, et al., "Generalized Type II Hybrid ARQ Scheme Using Punctured Convolutional Coding," IEEE Transactions on Communications, vol. 38, No. 11, pp. 1938-1946, Nov. 1990.

H. Samra, et al., "Integrated Iterative Equalization for ARQ Systems," IEEE International Conference on Acoustics, Speech, and Signal Processing, 2002 Proceedings, vol. 3, pp. III-2781- III-2784, May 2002.

K. H. Lee, et al., "Type II Hybrid ARQ Scheme based on QoS and LDPC Code," 2003 IEEE Wireless Communications and Networking, 2003, WCNC 2003, vol. 4, pp. 2630-2634, Dajeon, Korea, Sep. 2004.

H. Kim, et al., "New Turbo ARQ Techniques based on Estimated Reliabilities," 2003 IEEE Wireless Communications and Networking 2003, WCNC 2003, vol. 2, pp. 843-848, Mar. 2003.

Office Action in the corresponding Japanese Patent Application dated Sep. 7, 2010.

* cited by examiner

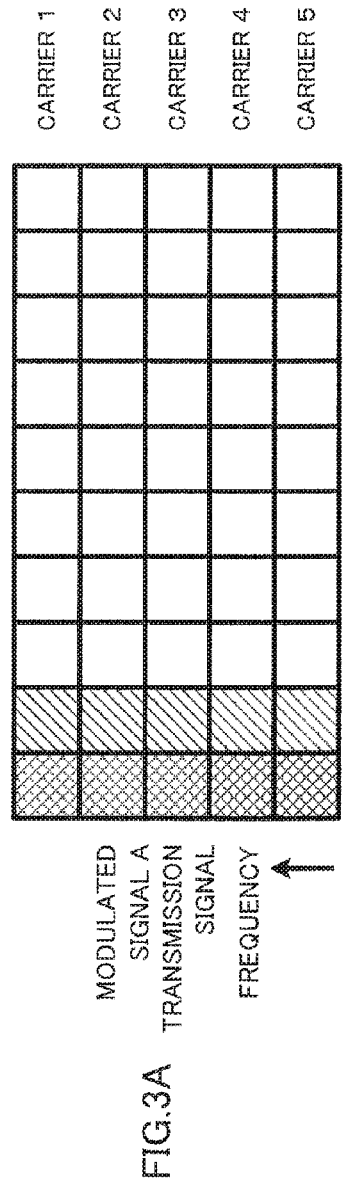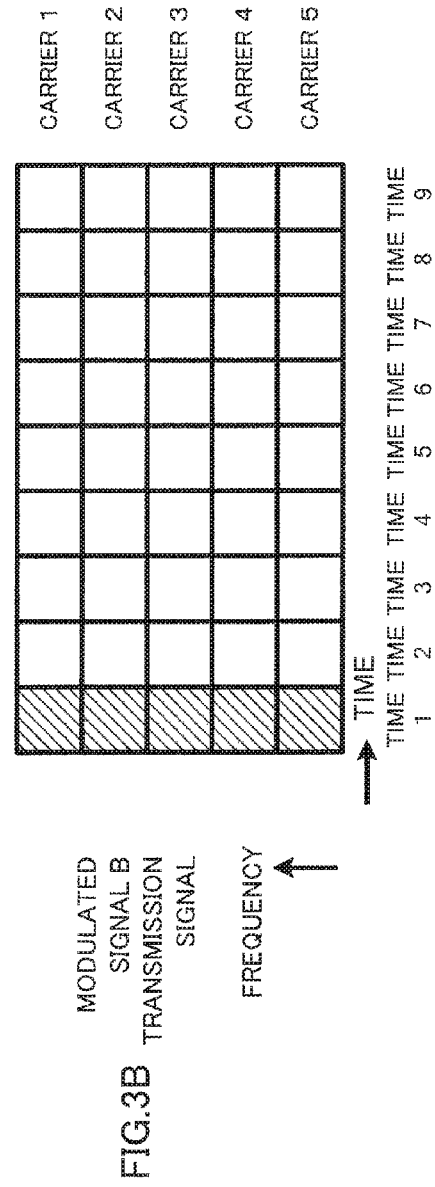

RECEPTION APPARATUS AND RECEPTION METHOD

This is a continuation application of application Ser. No. 14/244,579 filed Apr. 3, 2014, which is a continuation application of application Ser. No. 13/566,694 filed Aug. 3, 2012, which is a continuation application of application Ser. No. 11/720,046 filed May 23, 2007, which is a national stage of PCT/JP2005/021154 filed Nov. 17, 2005, which is based on Japanese Application No. 2004-340371 filed Nov. 25, 2004, the entire contents of each of which are incorporated by reference herein.

TECHNICAL FIELD

The present invention relates to a retransmission technique in a multi-antenna communication system such as OFDM-MIMO.

BACKGROUND ART

Conventionally, ARQ (Auto Repeat reQuest) is known as a retransmission technique in a radio communication. Furthermore, there is also a proposal of HARQ (Hybrid Auto Repeat reQuest) which combines turbo coding having high error correction performance and ARQ. In HARQ, by using puncturing processing, it is possible to suppress decrease in data transmission efficiency caused by retransmission. Such a conventional technique using ARQ and puncturing processing is disclosed in Non-Patent Document 1 and Non-Patent Document 2.

FIG. 1 shows a configuration example of a conventional transmission apparatus using ARQ and puncturing processing. Transmission apparatus 20 inputs transmission digital signal 1 to CRC (Cyclic Redundancy Check) encoder 2. CRC encoder 2 transmits transmission digital signal 3 after CRC encoding to convolution code encoder 4. Convolution code encoder 4 performs convolution encoding processing on transmission digital signal 3 after CRC encoding and transmits transmission digital signal 5 after convolution encoding to puncturing section 6.

Puncturing section 6 performs puncturing on transmission digital signal 5 after convolution encoding and transmits transmission digital signal 7 after puncturing to selection section 12 and also transmits redundant information 8 generated upon encoding to storage section 9. Here, when, for example, convolution code encoder 4 performs encoding at a coding rate of 1/2, puncturing section 6 forms transmission digital signal 7 after puncturing, for example, at a coding rate of 3/4.

Redundant information 8 stored in storage section 9 is discarded when an ACK (acknowledgement) signal is transmitted as ACK/NACK signal 11 from a communicating party, and transmitted to selection section 12 as a retransmission signal when a NACK (negative-acknowledgement) signal is transmitted.

Selection section 12 selects and outputs transmission digital signal 7 after puncturing when an ACK signal is inputted, and, on the other hand, selects and outputs redundant information 10 stored in storage section 9 when a NACK signal is inputted. That is, selection section 12 selects redundant information 10 as a retransmission signal only when there is a retransmission request.

Modulation section 14 performs modulation such as QPSK and 16QAM on transmission digital signal 13 selected by selection section 12 and transmits modulated signal 15 obtained in this way to radio section (RF section) 16. RF section 16 performs predetermined radio processing such as frequency conversion on modulated signal 15 and transmits transmission signal 17 obtained in this way to antenna 18.

Non-Patent Document 1: "Rate-compatible punctured convolutional codes and their applications," IEEE Transactions on Communications, pp. 389-400, vol. 36, no. 4, April 1988.

Non-Patent Document 2: "Generalized Type II Hybrid ARQ scheme using punctured convolutional coding" IEEE Transactions on Communications, pp. 1938-1946, vol. 38, no. 11, November 1990.

DISCLOSURE OF INVENTION

Problems to be Solved by the Invention

By the way, LDPC (Low Density Parity Check) coding attracts attention as a coding scheme capable of obtaining excellent coding gain such as having performance close to a Shannon limit, good block error rate performance and producing substantially no error floor.

However, when an attempt is made to perform ARQ using an LDPC code instead of a convolution code such as a turbo code, the following problem occurs. That is, when an attempt is made to realize ARQ by combining an LDPC code and puncturing processing, LDPC codes capable of performing appropriate puncturing processing are quite limited. Therefore, there is a problem that the flexibility of the design is reduced. Furthermore, when all data transmitted last time is retransmitted without performing puncturing processing, the amount of retransmission data increases, and such an attempt is not realistic.

Therefore, it is necessary to realize new ARQ which does not require puncturing processing. At this time, it is expected that only a small number of retransmission times is required and the method thereof is simple.

The present invention has been implemented in view of the above-described problems, and it is therefore an object of the present invention to provide a multi-antenna transmission apparatus, multi-antenna reception apparatus and data retransmission method capable of effectively improving received quality through retransmission using a simple method without limiting applicable LDPC codes and with less retransmission data in a multi-antenna communication system using LDPC codes.

Means for Solving the Problem

In order to solve the above-described problems, the present invention adopts a configuration including: an LDPC encoding section that encodes transmission data using an LDPC code; a transmission section that transmits the LDPC encoded transmission data assigned to a plurality of antennas; and a transmission control section that controls transmission so that, upon retransmission, only part of LDPC encoded data out of the LDPC encoded data transmitted last time is transmitted using a transmission method having a higher diversity gain than the last transmission.

According to this configuration, upon retransmission, only part of LDPC encoded data out of the LDPC encoded data transmitted last time is transmitted using a transmission method having a higher diversity gain than the last transmission, so that it is possible to receive part of the retransmitted LDPC code in a high quality condition. Here, the LDPC code has a much longer constraint length than that of a convolution code, and therefore, when the quality of part of the data is good, the LDPC code has a characteristic that, upon decoding, the error rate of the other decoded data is improved accompanying the part of the data having good quality, so that the overall error rate performance of the decoded data is improved. As a result, upon retransmission, it is possible to largely improve the error rate performance of received data through retransmission with less retransmission data than a convolution code or the like without deteriorating the flexibility of the LDPC code since puncturing is not performed.

Advantageous Effect of the Invention

As described above, according to the present invention, in a multi-antenna communication system using an LDPC code, it is possible to realize a multi-antenna transmission apparatus, multi-antenna reception apparatus and data retransmission method capable of effectively improving received quality through retransmission using a simple method, without limiting the applicable LDPC code and with less retransmission data.

BRIEF DESCRIPTION OF DRAWINGS

FIG. 3A and FIG. 3B show a frame configuration example of the modulated signals transmitted from antennas when a multi-antenna transmission apparatus carries out normal transmission (that is, transmission other than retransmission);

FIG. 8A shows input/output data of the LDPC encoding section, and FIG. 8B shows contents of retransmission data;

BEST MODE FOR CARRYING OUT THE INVENTION

The inventors of the present invention have focused on the fact that an LDPC code has a longer constraint length than a convolution code such as a turbo code and has a characteristic that, when received quality of part of data is good, the error rate characteristic of the other data also improves accompanying the part of the data having good quality. The inventors have also considered that, upon retransmission of the LDPC code, if only part of data is retransmitted with sufficient quality, it is possible to obtain sufficient effects of improving the error rate characteristic through retransmission using less retransmission data even if puncturing is not carried out.

Features of the present invention include transmitting, upon retransmission, only part of LDPC encoded data transmitted last time using a transmission method having a higher diversity gain than upon the last transmission. By this means, it is possible to effectively improve received quality through retransmission with less retransmission data even if puncturing is not carried out.

Embodiment

Hereinafter, an embodiment of the present invention will be explained in detail with reference to the accompanying drawings.

Figure 1:
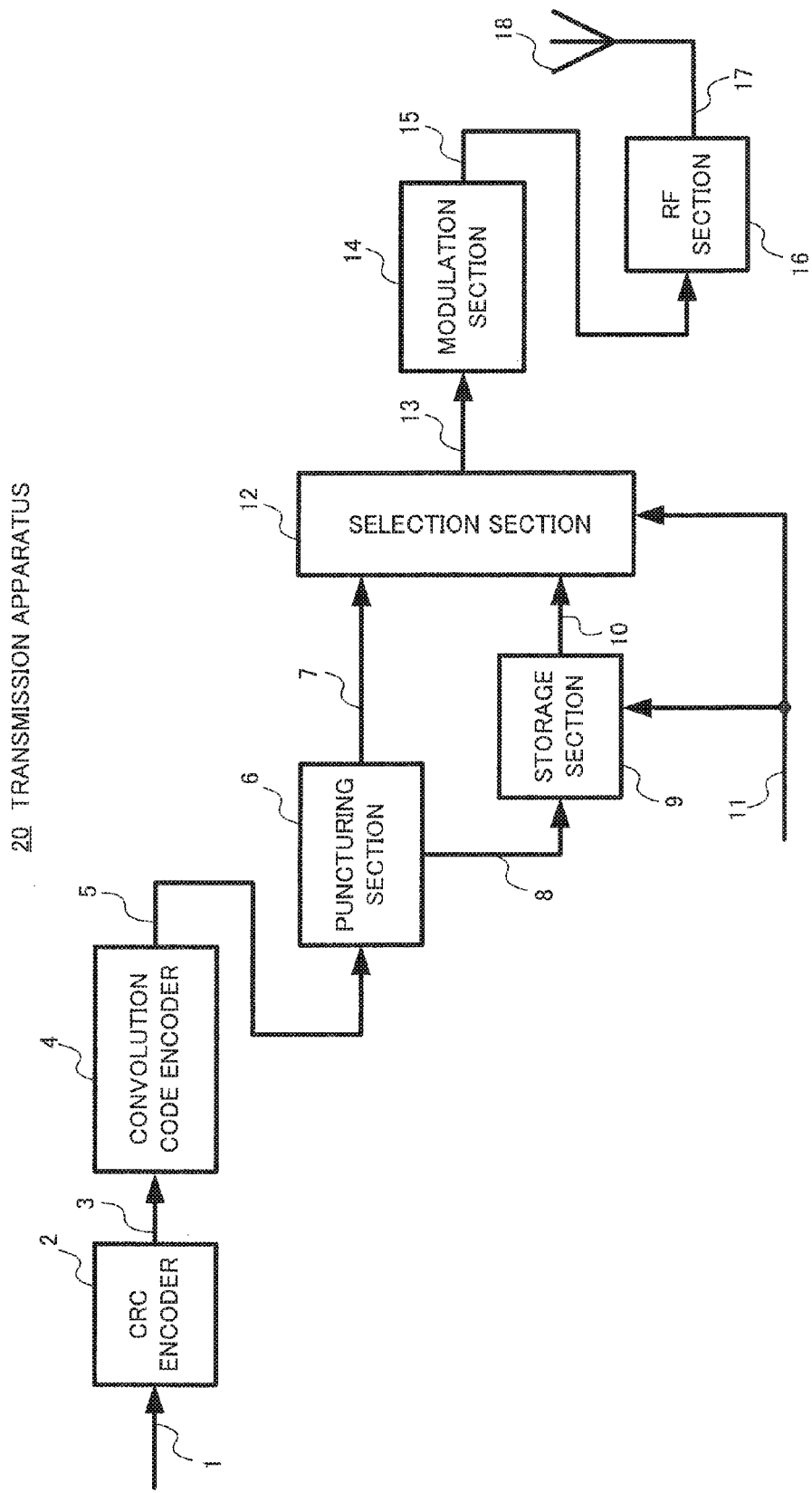
FIG. 1 is a block diagram showing the configuration of the conventional transmission apparatus which performs ARQ.
Figure 2:
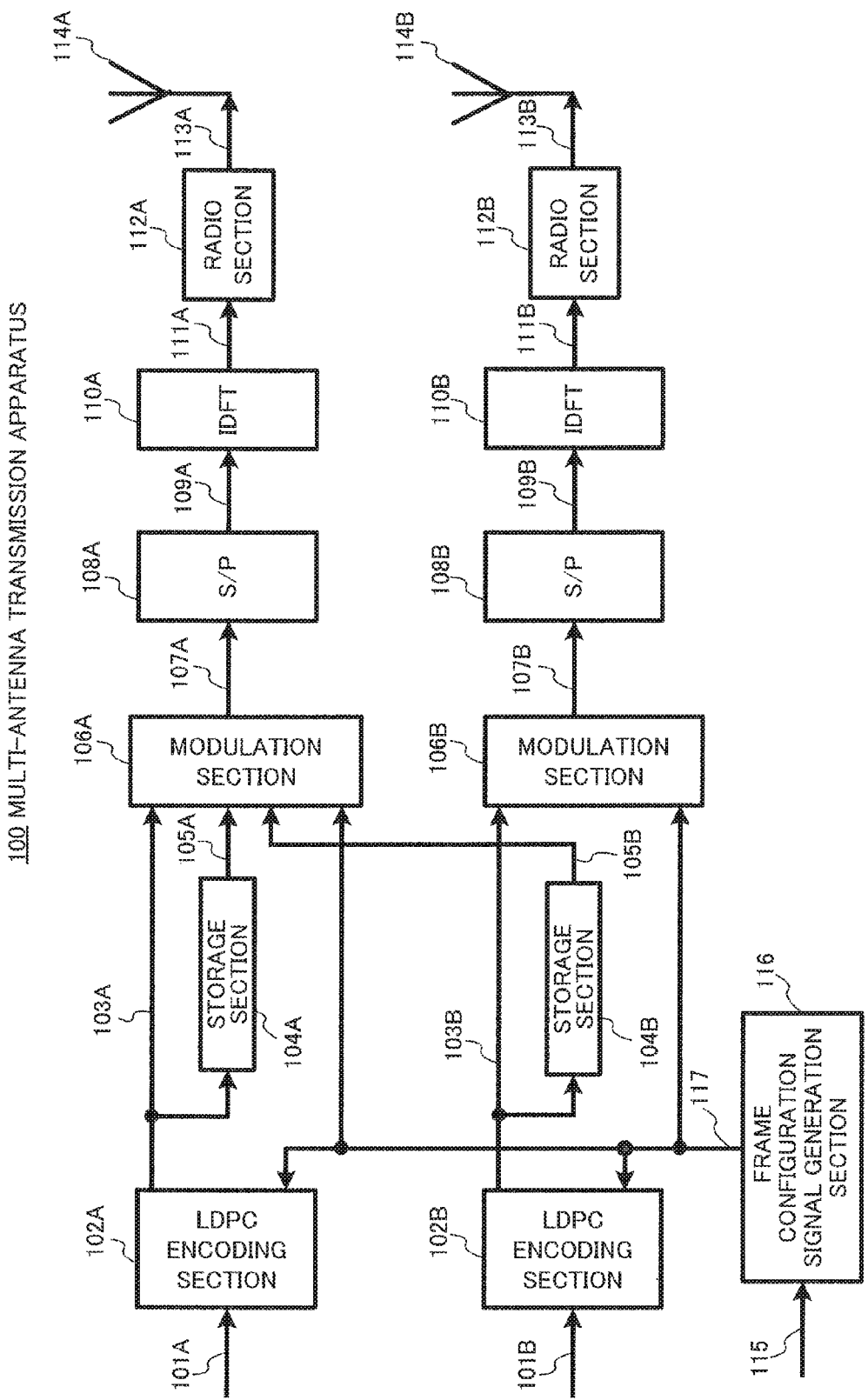
FIG. 2 is a block diagram showing the configuration of a multi-antenna transmission apparatus according to Embodiment 1 of the present invention.

FIG. 2 shows the configuration of a multi-antenna transmission apparatus according to the embodiment of the present invention. Multi-antenna transmission apparatus 100 is provided, for example, to a radio base station. Multi-antenna transmission apparatus 100 is a transmission apparatus which performs so-called OFDM-MIMO communication and designed to transmit different modulated signals from two antennas. More specifically, multi-antenna transmission apparatus 100 transmits modulated signal A from antenna 114A and transmits modulated signal B from antenna 114B. Here, in FIG. 2, the signal processing system relating to modulated signal A and the signal processing system relating to modulated signal B have substantially similar configuration, and therefore the processing system of modulated signal A is indicated as "A" appended to reference numerals, and the processing system of modulated signal B which corresponds to the signal processing system relating to modulated signal A is indicated as "B" appended to reference numerals.

Frame configuration signal generation section 116 of multi-antenna transmission apparatus 100 functions as a transmission control section, determines a transmission frame configuration based on ACK/NACK signal 115 which is retransmission request information transmitted from the communicating party (here, the communicating party is named a "terminal") and transmits the determined transmission frame configuration to LDPC encoding sections 102A and 102B and modulation sections 106A and 106B as frame configuration signal 117.

LDPC encoding sections 102A and 102B receive transmission digital signals 101A and 101B of modulated signal A and frame configuration signal 117 as input, perform CRC (Cyclic Redundancy Check) encoding and LDPC encoding on transmission digital signals 101A and 101B and transmit transmission digital signals 103A and 103B of encoded modulated signals A and B to modulation sections 106A and 106B. Furthermore, transmission digital signals 103A and 103B of encoded modulated signals A and B are stored in storage sections 104A and 104B, respectively. The data stored in storage sections 104A and 104B are used for retransmission.

Modulation sections 106A and 106B perform modulation processing such as QPSK (Quadrature Phase Shift Keying) and 16QAM. Modulation section 106A modulates any one of transmission digital signals 103A, 105A and 105B based on frame configuration signal 117. More specifically, when transmission is not retransmission, transmission digital signal 103A of encoded modulated signal A is modulated and outputted, and, when there is a request for retransmission of modulated signal A, transmission digital signal 105A of encoded modulated signal A which is stored in storage section 104A is modulated and outputted, and, when there is a request for retransmission of modulated signal B, transmission digital signal 105B of encoded modulated signal B which is stored in storage section 104B is modulated and outputted.

On the other hand, modulation section 106B modulates transmission digital signal 103B based on frame configuration signal 117. More specifically, when retransmission does not take place, transmission digital signal 103B of encoded modulated signal B is modulated and outputted, and nothing is outputted upon retransmission.

In this way, while different modulated signals A and B are transmitted from two antennas 114A and 114B during normal transmission, a modulated signal whose retransmission is requested is transmitted from only one antenna 114A upon retransmission. As a result, upon retransmission, the modulated signal transmitted from only one antenna 114A is received by a plurality of antennas on the reception side, so that it is possible to perform transmission with a high diversity gain. Therefore, the received quality upon retransmission can be improved compared to normal transmission.

Modulated signals 107A and 107B outputted from modulation sections 106A and 106B are converted to parallel signals 109A and 109B by serial/parallel conversion sections (S/P) 108A and 108B, respectively, subjected to inverse Fourier transform by inverse Fourier transform sections (idft) 110A and 110B that follow, resulting in OFDM signals 111A and 111B. OFDM signals 111A and 111B are subjected to predetermined radio processing such as frequency conversion by radio sections 112A and 112B, resulting in transmission signals 113A and 113B and then transmitted from antennas 114A and 114B. In this embodiment, it is assumed that the signal transmitted from antenna 114A is called "modulated signal A", and the signal transmitted from antenna 114B is called "modulated signal B" in principle.

FIG. 3A and FIG. 3B shows a frame configuration example of the modulated signals transmitted from antennas 114A and 114B when multi-antenna transmission apparatus 100 carries out normal transmission (that is, transmission other than retransmission). As shown in FIG. 3A and FIG. 3B, multi-antenna transmission apparatus 100 transmits modulated signal A and modulated signal B simultaneously from different antennas. In FIG. 3A and FIG. 3B, control information symbol 201 is a symbol to transmit control information such as a frame configuration, information as to whether or not data is retransmission data, and the number of retransmission times. Pilot symbol 202 is a symbol to estimate channel condition on the reception side. Data symbol 203 is CRC encoded and LDPC encoded data. The signal of modulated signal A in the frame configuration shown in FIG. 3A is transmitted from antenna 114A and the signal of modulated signal B in the frame configuration shown in FIG. 3B is transmitted from antenna 114B. Furthermore, it is assumed that symbols of the same carrier and the same time are transmitted simultaneously.

Figure 4:
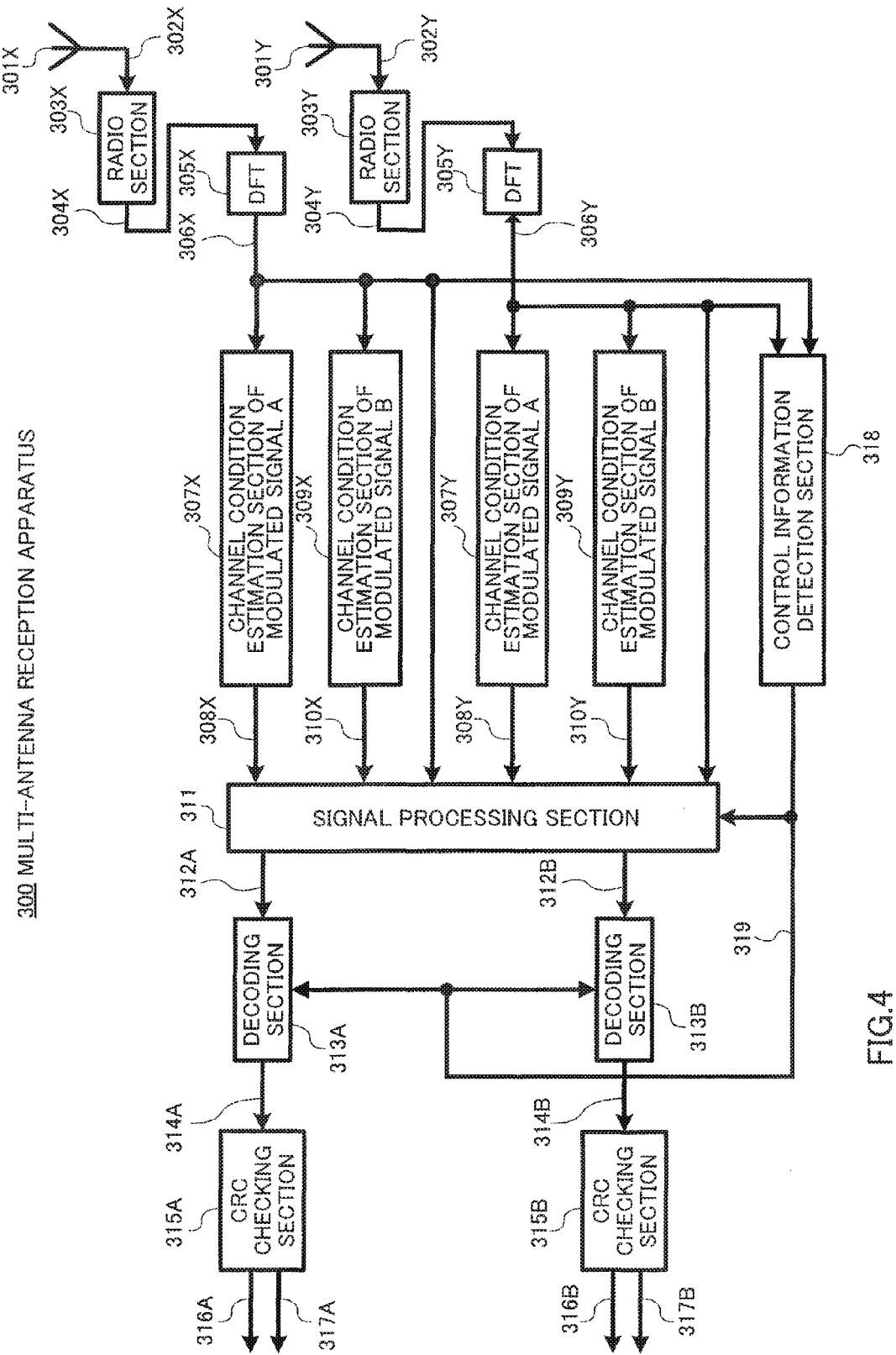
FIG. 4 is a block diagram showing the configuration of a multi-antenna reception apparatus according to Embodiment 1.

FIG. 4 shows the configuration of a multi-antenna reception apparatus of this embodiment. Multi-antenna reception apparatus 300 is provided to a terminal which communicates with the base station to which multi-antenna transmission apparatus 100 is provided.

Figure 5:
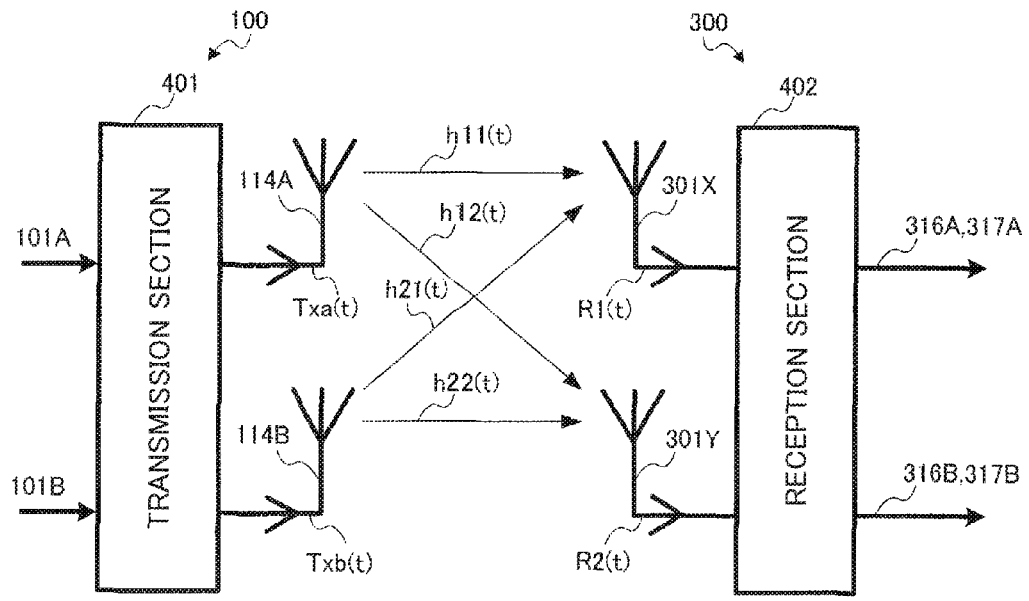
FIG. 5 shows an image of a multi-antenna communication system.

Furthermore, FIG. 5 shows the overall configuration of a multi-antenna communication system according to this embodiment. First, before explaining the configuration of multi-antenna reception apparatus 300 in FIG. 4, the overall operation of multi-antenna communication system 400 in FIG. 5 will be explained.

Multi-antenna communication system 400 has multi-antenna transmission apparatus 100 in FIG. 2 and multi-antenna reception apparatus 300 in FIG. 4. In multi-antenna transmission apparatus 100, transmission section 401 (equivalent to the part excluding antennas 114A and 114B in FIG. 2) forms modulated signal A (113A) and modulated signal B (113B) from transmission digital signals 101A and 101B and transmits modulated signal A (113A) and modulated signal B (113B) from antennas 114A and 114B. In FIG. 5, modulated signal A (113A) is indicated as Txa(t), and modulated signal B (113B) is indicated as Txb(t).

Multi-antenna reception apparatus 300 inputs received signals 302X and 302Y received at antennas 301X and 301Y (indicated as R1(t) and R2(t) in FIG. 5) to reception section 402 (equivalent to the part excluding antennas 301X and 301Y in FIG. 4). Reception section 402 performs demodulation processing on received signals R1(t) and R2(t) and thereby obtains received data 316A and 316B which correspond to transmission digital signals 101A and 101B. Furthermore, reception section 402 obtains ACK/NACK signals 317A and 317B which correspond to transmission digital signals 101A and 101B.

Here, modulated signal Txa(t) transmitted from antenna 114A is subjected to channel fluctuations $h11(t)$ and $h12(t)$ and received at antennas 301X and 301Y. On the other hand, modulated signal Txb(t) transmitted from antenna 114B is subjected to channel fluctuations $h21(t)$ and $h22(t)$ and received at antennas 301X and 301Y.

Therefore, the following relational expression holds.

[1]

$$\begin{pmatrix} R1(t) \\ R2(t) \end{pmatrix} = \begin{pmatrix} h11(t) & h21(t) \\ h12(t) & h22(t) \end{pmatrix} \begin{pmatrix} Txa(t) \\ Txb(t) \end{pmatrix} \quad \text{(Equation 1)}$$

Next, the configuration of multi-antenna reception apparatus 300 of this embodiment shown in FIG. 4 will be explained. Multi-antenna reception apparatus 300 inputs received signals 302X and 302Y received at antennas 301X and 301Y to radio sections 303X and 303Y. Radio sections 303X and 303Y perform predetermined radio processing such as frequency conversion on received signals 302X and 302Y, respectively, thereby obtain reception baseband signals 304X and 304Y and transmit reception baseband signals 304X and 304Y to Fourier transform sections (dft) 305X and 305Y.

Fourier transform sections 305X and 305Y perform Fourier transform processing on reception baseband signals 304X and 304Y, respectively and output signals 306X and 306Y after the Fourier transform.

Channel condition estimation section 307X of modulated signal A has signal 306X after the Fourier transform as input, detects pilot symbol 202 of modulated signal A in FIG. 3A and FIG. 3B, estimates channel fluctuation of modulated signal A based on pilot symbol 202 of modulated signal A, that is, estimates $h11(t)$ in equation 1. At this time, channel condition estimation section 307X of modulated signal A estimates the channel fluctuation of modulated signal A for each carrier. Then, channel condition estimation section 307X of modulated signal A outputs channel estimation signal 308X for each carrier of modulated signal A.

Channel condition estimation section 309X of modulated signal B has signal 306X after the Fourier transform as input, detects pilot symbol 202 of modulated signal B in FIG. 3A and FIG. 3B, estimates channel fluctuation of modulated signal B based on pilot symbol 202 of modulated signal B, that is, estimates h12(t) of equation 1. At this time, channel condition estimation section 309X of modulated signal B estimates channel fluctuation of modulated signal B for each carrier. Then, channel condition estimation section 309X of modulated signal B outputs channel estimation signal 310X for each carrier of modulated signal B.

Channel condition estimation section 307Y of modulated signal A has signal 306Y after the Fourier transform as input, detects pilot symbol 202 of modulated signal A in FIG. 3A and FIG. 3B, estimates channel fluctuation of modulated signal A based on this, that is, estimates h21(t) of equation 1. At this time, channel condition estimation section 307Y of modulated signal A estimates channel fluctuation of modulated signal A for each carrier. Then, channel condition estimation section 307Y of modulated signal A outputs channel estimation signal 308Y for each carrier of modulated signal A.

Channel condition estimation section 309Y of modulated signal B has signal 306Y after the Fourier transform as input, detects pilot symbol 202 of modulated signal B in FIG. 3A and FIG. 3B, estimates channel fluctuation of modulated signal B based on pilot symbol 202 of modulated signal B, that is, estimates h22(t) of equation 1. At this time, channel condition estimation section 309Y of modulated signal B estimates channel fluctuation of modulated signal B for each carrier. Then, channel condition estimation section 309Y of modulated signal B outputs channel estimation signal 310Y for each carrier of modulated signal B.

Control information detection section 318 has signals 306X and 306Y after the Fourier transform as input, detects control information symbol 201 in FIG. 3A and FIG. 3B, obtains control information 319 which consists of information of the frame configuration, information as to whether or not data is retransmission data, information of the number of retransmission times based on control information symbol 201 and outputs control information 319 to signal processing section 311 and decoding sections 313A and 313B.

Signal processing section 311 has channel estimation signals 308X and 308Y of modulated signal A, channel estimation signals 310X and 310Y of modulated signal B, signals 306X and 306Y after the Fourier transform, control information 319 as input, and, based on the frame configuration and information whether or not the data is retransmission data indicated by control information 319, separates, when the data is not retransmission data, each of modulated signals A and B by performing inverse matrix calculation in equation 1 and outputs the baseband signal of modulated signal A as baseband signal 312A and the baseband signal of modulated signal B as baseband signal 312B. On the other hand, in the case of retransmission data, signal processing section 311 performs maximum ratio combining, signal processing for a space-time block code or signal processing for Cyclic Delay Diversity and outputs baseband signal 312A and/or baseband signal 312B.

Decoding section 313A has baseband signal 312A and control information 319 as input, decodes modulated signal A based on the information as to whether or not the data is retransmission data in control information 319 and outputs digital signal 314A after decoding modulated signal A. At this time, when control information 319 indicates that the transmission is not retransmission, decoding section 313A performs normal LDPC decoding processing. On the other hand, when control information 319 indicates that the transmission is retransmission, decoding section 313A replaces the LDPC encoded data which corresponds to the retransmitted part of LDPC encoded data of the LDPC encoded data received last time (that is, the stored LDPC encoded data) by retransmitted LDPC encoded data and performs LDPC decoding processing.

CRC checking section 315A has digital signal 314A after decoding modulated signal A as input, carries out CRC check and detects a situation of error occurrence. Next, in the case where no error has occurred, CRC checking section 315A outputs received data 316A of modulated signal A and forms an ACK signal as an ACK/NACK signal 317A to be transmitted to the communicating party. On the other hand, in the case where an error has occurred, CRC checking section 315A forms a NACK signal as ACK/NACK signal 317A to be transmitted to the communicating party without outputting received data.

In the same way, decoding section 313B has baseband signal 312B and control information 319 as input, decodes modulated signal B based on the information as to whether or not the data is retransmission data in control information 319 and outputs digital signal 314B after decoding modulated signal B. At this time, when control information 319 indicates that the transmission is not retransmission, decoding section 313B performs normal LDPC decoding processing. On the other hand, when control information 319 indicates that the transmission is retransmission, decoding section 313B replaces the LDPC encoded data which corresponds to the retransmitted part of LDPC encoded data out of the LDPC encoded data received last time (that is, the stored LDPC encoded data) by the retransmitted LDPC encoded data and performs LDPC decoding processing.

CRC checking section 315B has digital signal 314B after decoding modulated signal B as input, performs a CRC check, detects a situation of error occurrence and outputs, when no error has occurred, received data 316B of modulated signal B and forms an ACK signal as ACK/NACK signal 317B to be transmitted to the communicating party. On the other hand, when an error has occurred, CRC checking section 315B forms a NACK signal as ACK/NACK signal 317B to be transmitted to the communicating party without outputting received data.

Figure 6:
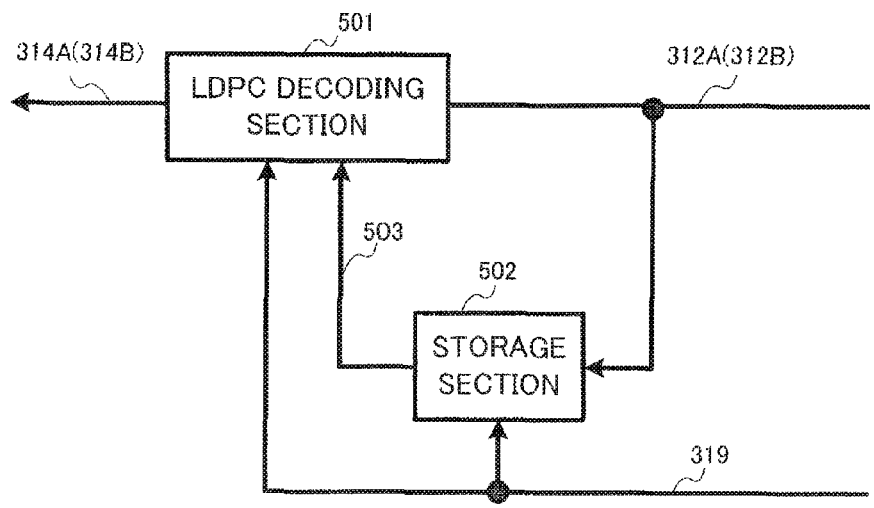
FIG. 6 is a block diagram showing the configuration of the decoding section.

FIG. 6 shows a configuration example of decoding section 313A (313B). Decoding section 313A and decoding section 313B have a similar configuration, and therefore only the configuration of decoding section 313A will be explained here.

Decoding section 313A has LDPC decoding section 501 and storage section 502. Storage section 502 stores baseband signal 312A received until the last time. When control information 319 indicates that the transmission is not retransmission, LDPC decoding section 501 performs LDPC decoding processing using the only baseband signal 312A received this time and obtains digital signal 314A after decoding. On the other hand, when control information 319 indicates that the transmission is retransmission, LDPC decoding section 501 performs LDPC decoding processing using baseband signal 503 stored until the last time in storage section 502 and baseband signal 312A retransmitted this time. At this time, LDPC decoding section 501 replaces the signal which corresponds to retransmitted baseband signal 312A (retransmitted part of LDPC encoded data) out of baseband signal 503 received until the last time stored in storage section 502 by retransmitted baseband signal 312A and performs LDPC decoding processing.

Next, the operation of this embodiment will be explained. First, an example of the overall flow of transmission/reception between multi-antenna transmission apparatus 100 (hereinafter, referred to as "base station") and multi-antenna reception apparatus 300 (hereinafter, referred to as "terminal") is shown in FIG. 7.

Figure 7:
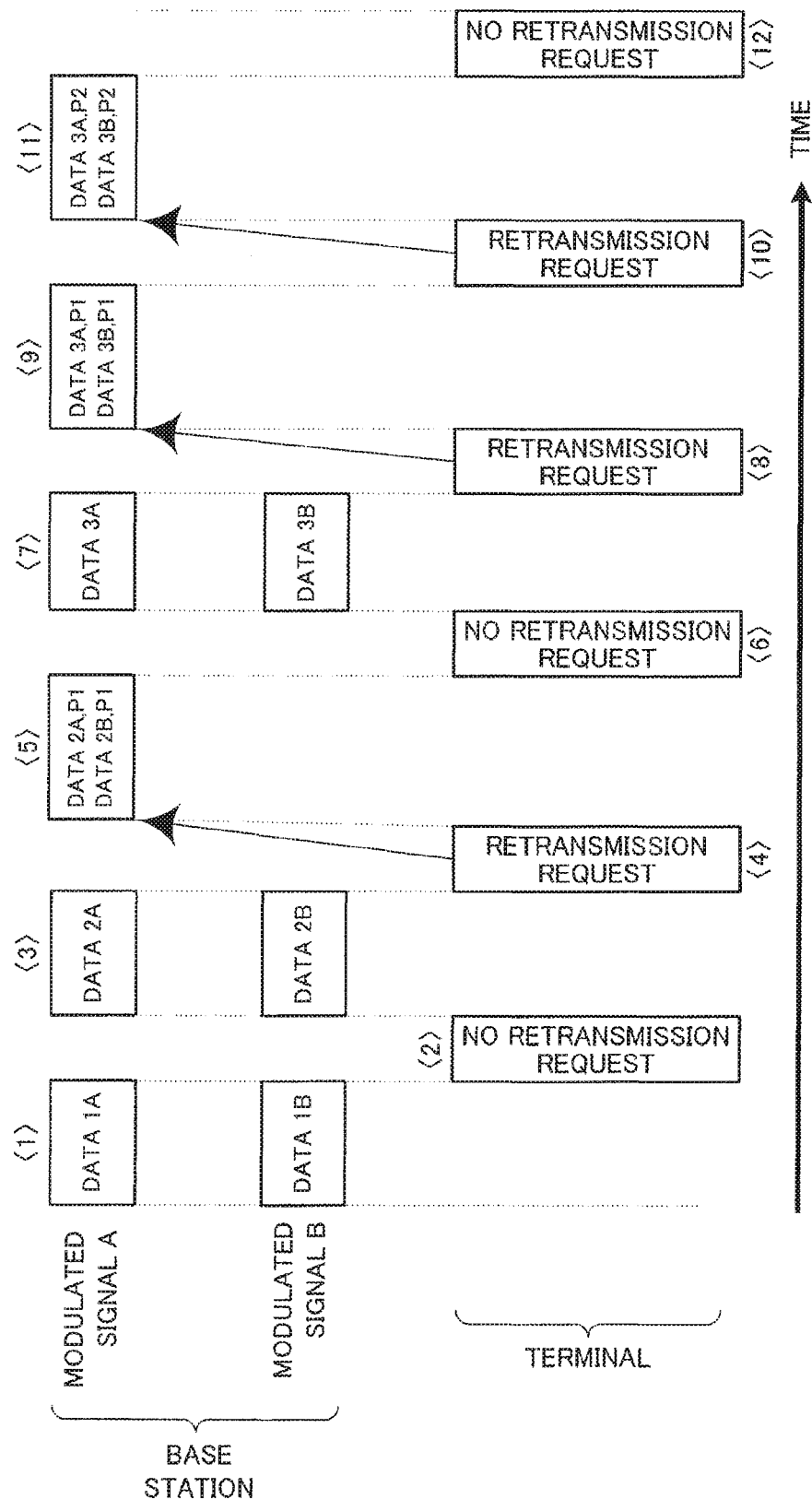
FIG. 7 is a data flow chart illustrating the operation of the embodiment.

First, the base station transmits data 1A with modulated signal A and data 1B with modulated signal B as shown in FIG. 7 <1>.

The terminal receives this signal, but, when no error has occurred, the terminal does not transmit any retransmission request to the base station as shown in FIG. 7 <2>. The base station then transmits new data 2A with modulated signal A and new data 2B with modulated signal B as shown in FIG. 7 <3>.

The terminal receives this signal, and, when an error has occurred, the terminal transmits a retransmission request to the base station as shown in FIG. 7 <4>. The base station then retransmits only part of data (hereinafter, such data will be referred to as "partial data") 2A and P1 out of data 2A transmitted last time, and partial data 2B and P1 out of data 2B transmitted last time as shown in FIG. 7 <5>.

The terminal performs LDPC decoding using the received signals of data 2A and data 2B transmitted by the base station in FIG. 7 <3> and the received signals of partial data 2A and P1 of modulated signal A and partial data 2B and P1 of modulated signal B transmitted in FIG. 7 <5>. As a result, when no error occurs, as shown in FIG. 7 <6>, no retransmission request is transmitted to the base station. The base station then transmits new data 3A with modulated signal A and new data 3B with modulated signal B as shown in FIG. 7 <7>.

The terminal receives this signal, and, when an error has occurred, the terminal transmits a retransmission request to the base station as shown in FIG. 7 <8>. The base station then retransmits only partial data of 3A and P1 of data 3A transmitted last time and partial data 3B and P1 of data 3B transmitted last time as shown in FIG. 7 <9>.

The terminal performs LDPC decoding using the received signals of data 3A and data 3B transmitted by the base station in FIG. 7 <7> and the received signals of partial data 3A and P1 of modulated signal A and partial data 3B and P1 of modulated signal B transmitted in FIG. 7 <9>. As a result, when an error still occurs, a retransmission request is transmitted again to the base station as shown in FIG. 7 <10>.

The base station then retransmits the only partial data 3A and P2 of data 3A and partial data 3B and P2 of data 3B as shown in FIG. 7 <11>. Partial data 3A and P2 transmitted through this second retransmission is data which is different from partial data 3A and P1 at the first retransmission. In the same way, partial data 3B and P2 transmitted through the second retransmission is data which is different from partial data 3B and P1 transmitted through the first retransmission.

The terminal performs LDPC decoding using the received signals of data 3A and data 3B transmitted by the base station in FIG. 7 <7>, the received signals of partial data 3A and P1 and partial data 3B and P1 transmitted in FIG. 7 <9> and partial data 3A and P2 and partial data 3B and P2 transmitted in FIG. 7 <11>. As a result, when no error occurs, no retransmission request is transmitted to the base station as shown in FIG. 7 <12>.

Next, the operations of LDPC encoding sections 102A and 102B will be explained in detail using FIG. 8A and FIG. 8B. However, to simplify explanations here, CRC encoding will be omitted. Furthermore, especially as shown in FIG. 7, the cases will be described as examples where data 3A is transmitted first, partial data 3A and P1 are retransmitted first, and partial data 3A and P2 are retransmitted at the second time and where data 3B is transmitted first, partial data 3B and P1 are retransmitted first and partial data 3B and P2 are retransmitted at the second time.

LDPC encoding section 102A for modulated signal A outputs LDPC encoded data 103A by performing LDPC encoding on transmission digital signal 101A before encoding. For example, assuming that transmission digital signal 101A is (m1$a$, m2$a$, . . . , m1603$a$) and a parity check matrix is G, (C1$a$, C2$a$, . . . , C2000$a$) is outputted as LDPC encoded data 103A.

LDPC encoding section 102B for modulated signal B performs LDPC encoding on transmission digital signal 101B before encoding and thereby outputs LDPC encoded data 103B. For example, assuming that transmission digital signal 101B is (m1$b$, m2$b$, . . . , m1603$b$) and a parity check matrix is G, (C1$b$, C2$b$, . . . , C2000$b$) is outputted as LDPC encoded data 103B.

Upon first transmission, the LDPC encoded data (C1$a$, C2$a$, . . . , C2000$a$), (C1$b$, C2$b$, . . . , C2000$b$) generated in this way are transmitted as data 3A and 3B from different antennas 114A and 114B. Furthermore, part or all of LDPC encoded data (C1$a$, C2$a$, . . . , C2000$a$) is stored in storage section 104A and part or all of LDPC encoded data (C1$b$, C2$b$, . . . , C2000$b$) is stored in storage section 104B.

Figure 8:
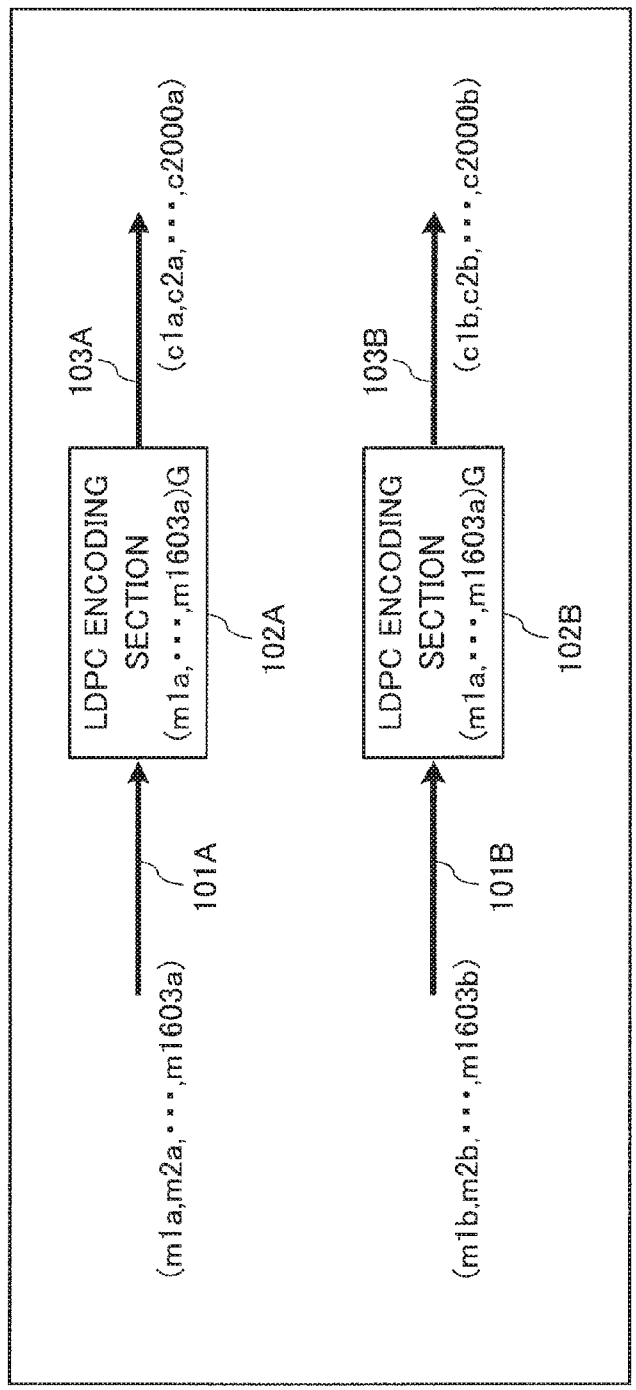
FIG. 8A and FIG. 8B illustrate the operation of the LDPC coding section.

Then, upon first retransmission, part of LDPC encoded data (C101$a$, C102$a$, . . . , C600$a$) stored in storage section 104A is transmitted as partial data 3A and P1 as shown in FIG. 8B, and part of LDPC encoded data (C101$b$, C102$b$, . . . , C600$b$) stored in storage section 104B is transmitted as partial data 3B and P1. Here, in this embodiment, upon retransmission of the partial data, the partial data is transmitted only from one antenna 114A.

Upon second retransmission as shown in FIG. 8B, the LDPC encoded data (C901$a$, C902$a$, . . . , C1400$a$) of the LDPC encoded data stored in storage section 104A, which is different from the LDPC encoded data retransmitted at the first time is transmitted as partial data 3A and P2, and the LDPC encoded data (C901$b$, C902$b$, . . . , C1400$b$) of the LDPC encoded data stored in storage section 104B, which is different from the LDPC encoded data retransmitted at the first time is transmitted as partial data 3B and P2. When the partial data is retransmitted, the data is also transmitted only from one antenna 114A.

When such retransmission is performed, the processing of decoding section 313A shown in FIG. 6 will be explained. First, when data 3A and 3B are transmitted at the first transmission (FIG. 7 <7>), LDPC decoding section 501 performs LDPC decoding on data 3A and 3B and stores data 3A and 3B in storage section 502. Upon first retransmission (FIG. 7 <9>), LDPC decoding section 501 performs LDPC decoding processing using retransmitted partial data 3A and P1, partial data 3B and P1, and data 3A and 3B stored in storage section 502 and also stores retransmitted partial data 3A and P1, and partial data 3B and P1 in storage section 502. Upon second retransmission (FIG. 7 <11>), LDPC decoding section 501 performs LDPC decoding processing using retransmitted partial data 3A and P2, partial data 3B and P2, and data 3A, 3B, 3A, P1, 3B and P1 stored in storage section 502.

Next, the reason will be explained why, by transmitting a retransmission signal only from one antenna 114A upon retransmission as in this embodiment, a greater diversity gain than that upon normal transmission can be obtained, and received quality of retransmission data (partial data) can be improved.

Figure 9:
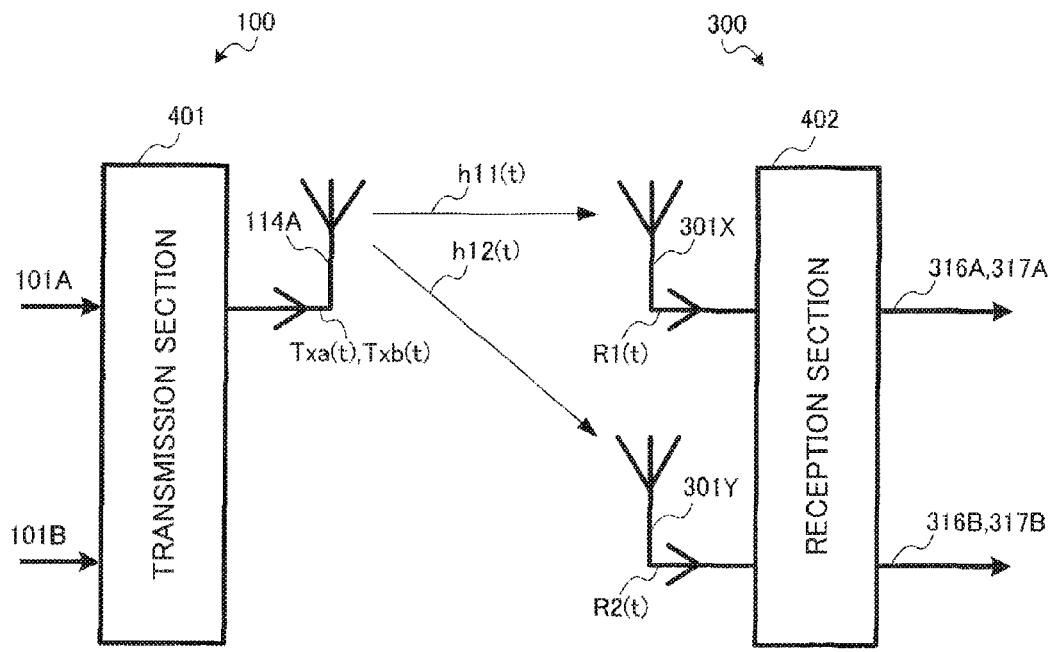
FIG. 9 shows an image of a system for maximum ratio combining.

FIG. 9 shows an image when transmitting retransmission data with the same reference numerals assigned to the corresponding components in FIG. 5. Multi-antenna transmission apparatus 100 transmits the modulated signal only from antenna 114A. The modulated signal transmitted from antenna 114A is multiplied by propagation coefficients of h11($t$) and h12($t$) on the propagation path and received at receive antennas 301X and 301Y. Therefore, reception section 402 of multi-antenna reception apparatus 300 can combine the modulated signals transmitted from antenna 114 at a maximum ratio, so that received quality of the retransmitted data improves.

By the way, data 3A and data 3B transmitted from different antennas in FIG. 7 <7> have poor received quality, and therefore the terminal transmits a retransmission request as shown in FIG. 7 <8>. At this time, in an environment in which no considerable change occurs in the propagation environment, when retransmission data is also transmitted after being subjected to MIMO multiplexing in the same way as in FIG. 7 <7>, it leads to a little improvement effect in received quality, but may not lead to a considerably large improvement effect.

On the other hand, in this embodiment, by transmitting partial data of the LDPC encoded data from fewer antennas upon retransmission than upon the last transmission, a greater diversity gain can be obtained on the reception side, so that it is possible to improve received quality of the retransmitted partial data even in an environment in which no considerable change occurs in the propagation environment and obtain a considerable improvement effect in received quality through retransmission.

In addition, by decreasing the M-ary number upon retransmission, received quality can be further improved, so that it is possible to obtain a further greater improvement effect in received quality through retransmission.

Here, the difference between the transmission method of the present invention and the conventional ARQ is that data 3A and P1, data 3A and P2, data 3B and P1, and data 3B and P2 retransmitted in this embodiment are not the data obtained through puncturing, but merely partial data (part of the data transmitted last time). In this way, since no puncturing processing is performed in this embodiment, this embodiment can be applied to any LDPC code. That is, the LDPC code is not limited by puncturing processing.

Furthermore, in the conventional ARQ using puncturing, data to be retransmitted is limited to redundant information generated upon puncturing (that is, generated upon encoding), but the retransmission method of this embodiment is never limited to this, and therefore it is possible to perform quite flexible retransmission. For example, it is possible to perform processing such as receiving information equivalent to the received quality simultaneously with an ACK/NACK signal from the communicating party and changing the amount of partial data to be retransmitted, and also adopt an adaptive retransmission method such as changing the amount of the retransmission data according to a communication situation.

Here, in this embodiment, the reason will be explained why it is possible to effectively reduce errors in received data through simple retransmission processing such as retransmitting only partial data without performing any puncturing processing.

For example, when using a convolution code, partial data is retransmitted without performing puncturing as in the case of this embodiment. A convolution code has quite a short constraint length than that of an LDPC code. The convolution code generally uses a constraint length of approximately 10. Therefore, even if partial data of good quality is transmitted, the influence thereof remains within the range of the constraint length. Therefore, in order to improve the overall error rate performance of the data block, it is necessary to transmit a large amount of partial data. Therefore, it is possible to say that the method of retransmitting the partial data as described in this embodiment is not so suitable for the case where a convolution code is used.

On the other hand, as this embodiment, when partial data is retransmitted without puncturing when an LDPC code is used, it is possible to obtain remarkable effects. This results from the fact that the constraint length of the LDPC code is much longer than that of the convolution code. This will be explained using FIG. 8A and FIG. 8B. For example, transmission digital signal m1$a$ on the reception side is estimated using some of information of the LDPC encoded data (C1$a$, C2$a$, . . . , C2000$a$) generated using parity check matrix G. When the received quality of part of some of the information is improved, the received quality (that is, an error rate characteristic) of transmission digital signal m1$a$ is improved. This is not limited to transmission digital signal m1$a$, but the same also applies to transmission digital signals m2$a$ to m1603$a$. That is, since the LDPC code has a long constraint length, by improving the error rate performance of partial data, it is also possible to improve the error rate characteristic of many other data within the constraint length. By this means, it is possible to effectively improve the error rate characteristic without the LDPC code being limited by puncturing processing and with a small amount of retransmission.

Next, a preferable example of the method of selecting partial data to be retransmitted (hereinafter, referred to as "partial data") will be explained.

It is assumed that message m=($m_1$, . . . , $m_t$), transmission sequence X=($x_1$, . . . , $x_n$)$^T$ and reception sequence Y=($y_1$, . . . , $y_n$)$^T$. Here, m<n, $^T$ indicates transposition. When it is assumed that a generator matrix is G and an check matrix is H, the relationship in the following expression holds.

[2]

$$GH^T=0 \qquad \text{(Equation 2)}$$

In LDPC encoding, transmission sequence X is generated from message m and generator matrix G. On the decoding side, decoding is performed using reception sequence Y and check matrix H.

Here, assuming that K pieces of partial data are retransmitted, the method of selecting the K pieces of data will be explained.

Attention will be focused on a vector of column p and a vector of column q of check matrix H. It is assumed that the number of "1"s of the vector of column p is P and the number of "1"s of the vector of column q is Q. Here, it is assumed that P>Q. In this case, when transmission sequence xp is compared with transmission sequence xq, transmission sequence xp has stronger resistance to noise than transmission sequence xq. When this is taken into consideration, as partial data to be retransmitted, it is preferable to select transmission sequence xp which has more "1"s compared to selecting transmission sequence xq in a column vector of an check matrix.

The present application adopts the above-described concept. More specifically, top K (K<n) column vectors having many "1"s of a vector of column j (1<j<n) of check matrix H are searched. Here, it is assumed that a set of top K column vectors having many "1"s is (r1, ..., rK). Assuming that the transmission bit obtained using column vector r1 is $x_{r1}$, ..., the transmission bit obtained using column vector rK is $x_{rK}$, transmission bits ($x_{r1}$, ..., $x_{rK}$) are selected as the partial data to be retransmitted. That is, K-bit data obtained using top K (1<K<n) column vectors which include more "1"s out of n column vectors of check matrix H is retransmitted as the partial LDPC encoded data. By this means, data having strong resistance to error can be used as retransmission data, so that it is possible to expect a further improvement effect in received quality through retransmission.

Here, as the above-described method of transmitting retransmission data, the following two methods can be considered.

First, transmission bits ($x_{r1}$, ..., $x_{rK}$) are always assumed to be retransmission data. That is, also upon retransmission of the second time or later, transmission bits ($x_{r1}$, ..., $x_{rK}$) are transmitted.

Second, the data to be retransmitted is changed according to the number of retransmission times. That is, transmission bits ($x_{r1}$, ..., $x_{rK}$) are transmitted at the first retransmission. At the second retransmission, the set of top K column vectors (r1, ..., rK) having most "1"s is excluded, and transmission bits ($x_{s1}$, ..., $x_{sK}$) which correspond to a set (s1, ..., sK) of top K column vectors having the second most "1"s is assumed to be the retransmission data. The retransmission of the third time or later will also be considered in a similar way.

Furthermore, when the above-described retransmission is performed, if the LDPC code to be used is determined, the information of the column vector used for retransmission can be shared on the transmission side and the reception side, so that it is possible to readily decode the retransmitted partial bits on the reception side.

Thus, according to this embodiment, at multi-antenna transmission apparatus 100 which transmits LDPC encoded data from a plurality of antennas, upon retransmission, by transmitting only part of the LDPC encoded data out of the LDPC encoded data transmitted last time using a transmission method having a higher diversity gain than upon the last transmission, it is possible to realize ARQ having a greater improvement effect in received quality through retransmission using a simple method, without limiting applicable LDPC codes and with less retransmission data.

Furthermore, part of LDPC encoded data can be retransmitted without being restricted by the puncturing processing, so that it is also possible to realize extremely flexible retransmission such as changing the amount of data adaptively.

Furthermore, when retransmission is performed a plurality of times, as shown in FIG. 8B, for example, part of LDPC encoded data to be retransmitted is changed for every retransmission, so that it is possible to further enhance the improvement effect in received quality through retransmission.

In the above-described embodiment, the case has been described where the partial data as shown in FIG. 8B is retransmitted, but the partial data to be retransmitted is not limited to the example shown in FIG. 8B. It is more preferable to select partial data to be retransmitted also taking into consideration fluctuation in the propagation environment. The propagation environment generally changes gradually in the time direction and in the frequency direction. Therefore, when the partial data to be transmitted is comprised of only symbols which exist in a biased frequency band or symbols which exist in a biased time, there is a high possibility that the diversity effect may decrease. Considering the diversity effect, partial data is formed by selecting symbols discretely in time and/or discretely in a frequency. By this means, the time diversity effect and/or the frequency diversity effect can be obtained, so that it is possible to further improve received quality of partial data and further enhance the improvement effect in received quality through retransmission.

Furthermore, in the above-described embodiment, the case has been described where LDPC codes are used alone, but the present invention can be also applied to a case where concatenated codes which use LDPC codes together with other error correcting codes are used.

Other Embodiment

In the above-described embodiment, the case has been described where, by transmitting partial data of the LDPC encoded data from fewer antennas upon retransmission than upon the last transmission, upon retransmission, transmission using a transmission method with a higher diversity gain than upon the last transmission is realized, but the transmission method with a high diversity gain carried out upon retransmission is not limited to the above-described embodiment, and, for example, space-time block codes and Cyclic Delay Diversity may also be used as the transmission method for obtaining a high diversity gain. Moreover, it is more effective to decrease the M-ary number for each retransmission time.

Here, the case will be described where space-time block codes and Cyclic Delay Diversity are applied to retransmission.

Figure 10:
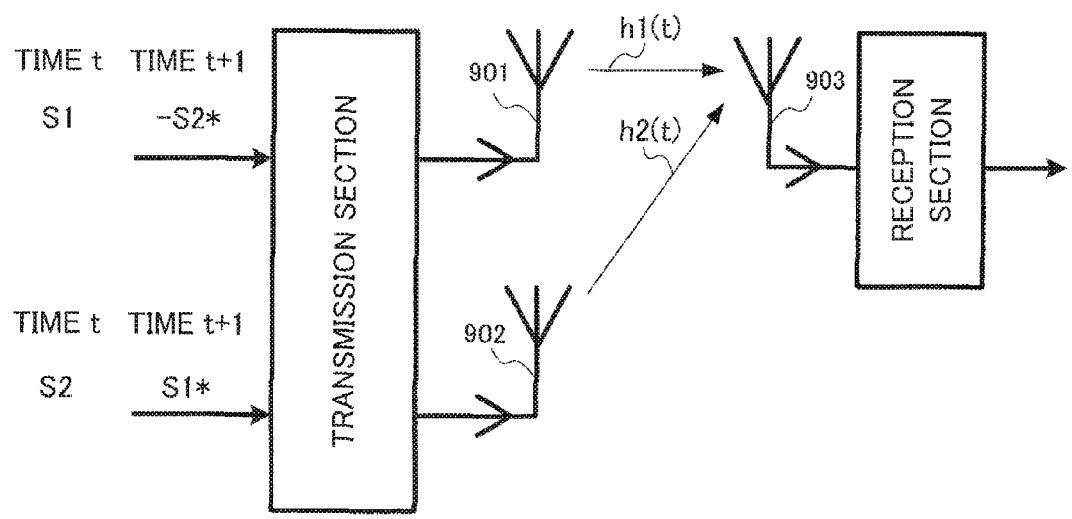
FIG. 10 illustrates a space-time block code.

FIG. 10 shows an example of the transmission method when space-time block codes are used. From transmission antenna 901, symbol S1 is transmitted at time t, and symbol −S2* is transmitted at time t+1. From transmission antenna 902, symbol S2 is transmitted at time t, and symbol S1* is transmitted at time t+1. Here, * indicates a conjugate complex number. In this way, by using space-time block encoded signals, respective symbols S1 and S2 can be combined at a maximum ratio upon signal separation regardless of transmission path fluctuations h1(t) and h2(t), so that it is possible to obtain a large coding gain and a diversity gain. Therefore, the received quality of the retransmission data—the error rate performance—can be improved. In this way, by transmitting data to be retransmitted using space-time block codes, it is possible to obtain an effect equivalent to or higher than that of reducing the number of transmit antennas upon retransmission.

Figure 11:
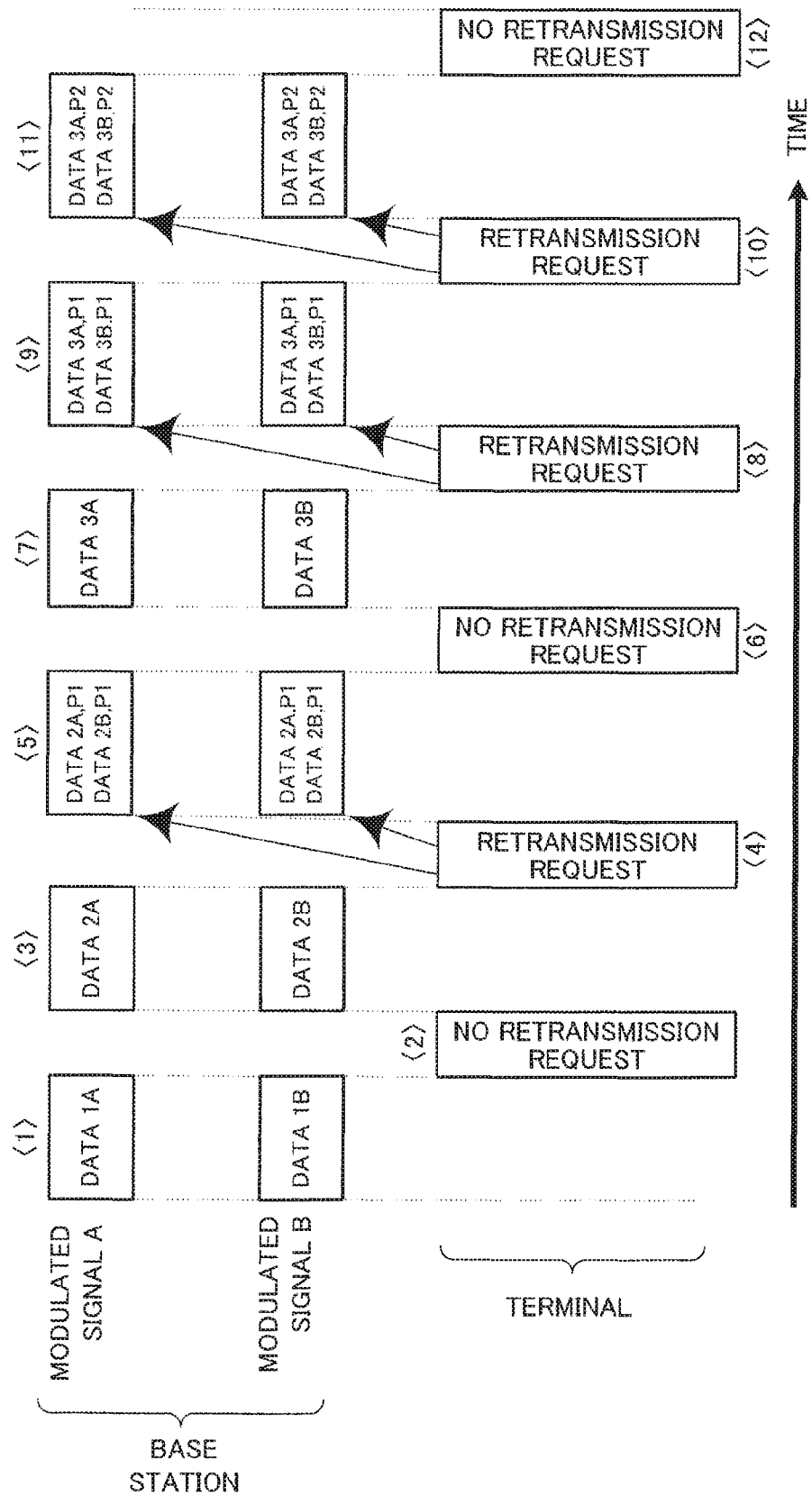
FIG. 11 is a data flow chart in the case of retransmitting retransmission data using the space-time block code.

FIG. 11 shows a data flow between the base station and the terminal in this case. The difference between FIG. 11 and FIG. 7 is that retransmission data 2A and P1, retransmission data 2B and P1, retransmission data 3A and P1, retransmission data 3B and P1, retransmission data 3A and P2 and retransmission data 3B and P2 are transmitted using modulated signal A and modulated signal B.

Figure 12:
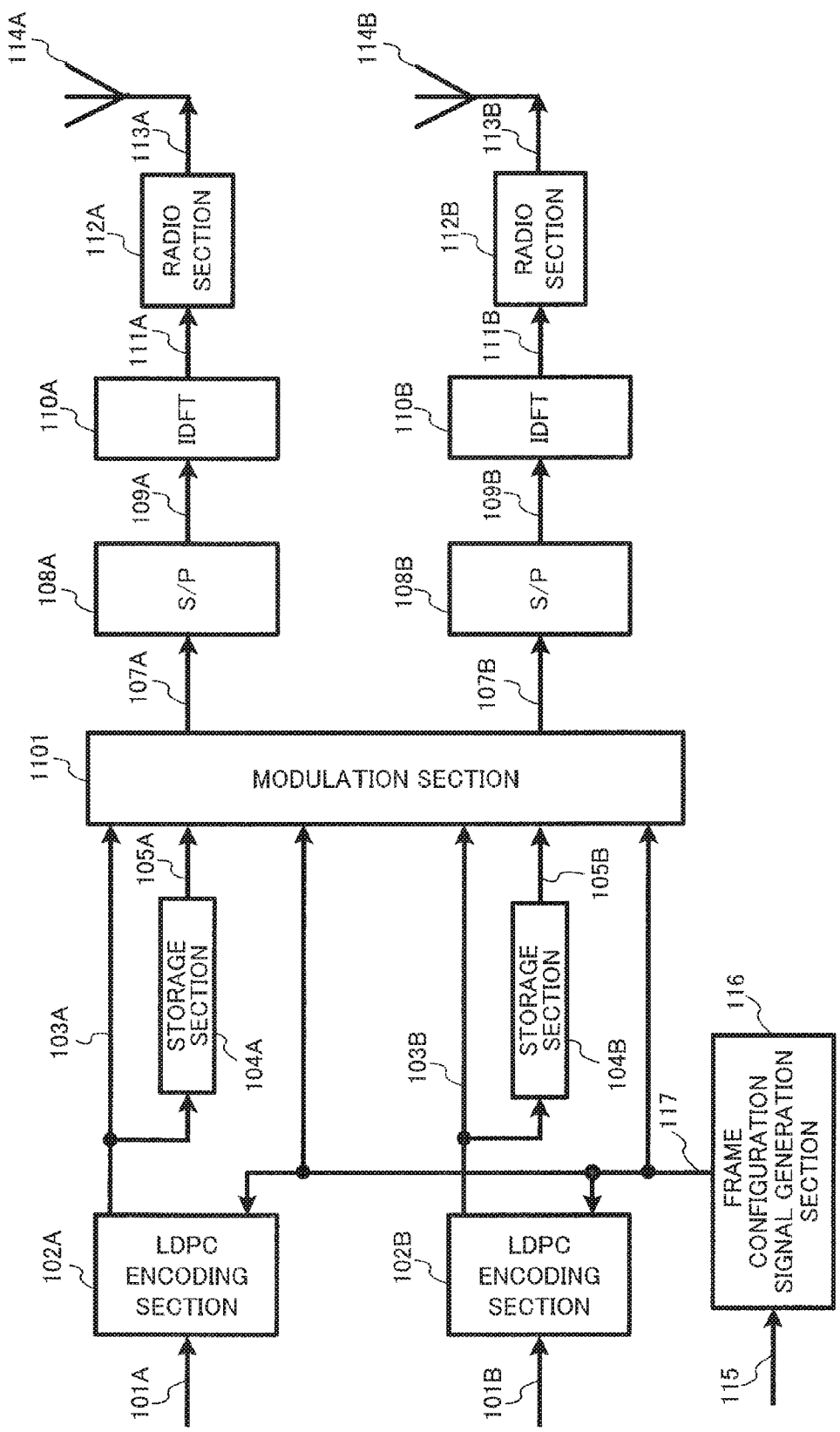
FIG. 12 is a block diagram showing the configuration of a multi-antenna transmission apparatus which retransmits retransmission data using the space-time block code.

FIG. 12 shows a configuration example of a multi-antenna transmission apparatus in the case of transmitting partial data of LDPC to be retransmitted using space-time block codes. In FIG. 12 in which components corresponding to those in FIG. 2 are assigned the same reference numerals, the difference between multi-antenna transmission apparatus 1100 and multi-antenna transmission apparatus 100 in FIG. 2 is that modulation section 1101 is shared among channels so as to allow space-time block encoding. When inputted frame configuration signal 117 indicates that transmission is not retransmission, modulation section 1101 outputs serial signals 107A and 107B of modulated signal A and modulated signal B without performing space-time block encoding. On the other hand, when inputted frame configuration signal 117 indicates that transmission is retransmission, modulation section 1101 performs space-time block encoding and outputs serial signals 107A and 107B of modulated signal A and modulated signal B.

Upon receiving such space-time block codes, when control information 319 indicates retransmission data, signal processing section 311 of multi-antenna reception apparatus 300 (FIG. 4) performs signal processing for separating space-time block codes and outputs baseband signal 312A of modulated signal A and baseband signal 312B of modulated signal B.

Here, the case has been described as an example where space-time block codes are transmitted using two transmit antennas, but the space-time block codes are not limited to the above-described ones, and, even in a case where transmission is performed using three or more transmit antennas, space-time blocks corresponding thereto may be used. Furthermore, the case has been described as an example where encoding is performed on the time axis, but encoding is not limited to the above-described explanation, and in the case of a multicarrier scheme such as OFDM, encoding may also be performed using the frequency axis. For example, it is also possible to transmit S1 with carrier i and −S2* with carrier i+1 at time t from transmission antenna 901 and transmit S2 with carrier i and S1* with carrier i+1 at time t from transmission antenna 902.

Next, an example of Cyclic Delay Diversity will be explained using FIG. 13.

Figure 13:
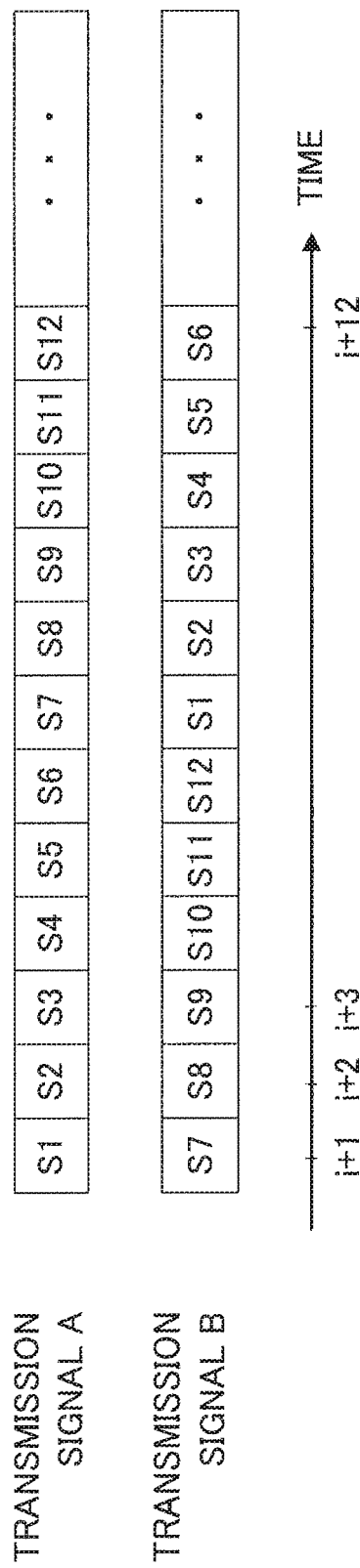
FIG. 13 illustrates Cyclic Delay Diversity.

FIG. 13 shows an example of the frame configuration when Cycled Delay Diversity is performed using 12 symbols. The signal transmitted at antenna 114A in FIG. 2 is transmission signal A in FIG. 13, and the signal transmitted with antenna 114B in FIG. 2 is transmission signal B in FIG. 13. As for transmission signal A, S1, S2, . . . S11, S12 are transmitted at times i+1, i+2 . . . , i+11, i+12, respectively. Transmission signal B has the frame configuration shifted by a given time period with respect to transmission signal A. Here, S7, 58, . . . , S5, S6 are transmitted at times i+1, i+2, . . . , i+11, i+12, respectively. By adopting such a frame configuration, a diversity gain can be obtained on the reception apparatus side by equalizing the received signals, so that it is possible to improve received quality of signals S1 to S12 and improve the error rate characteristic of data. That is, by using Cycled Delay Diversity upon retransmission of the partial data of LDPC, it is possible to improve received quality of retransmission data and thereby improve the overall error rate performance of the received data.

Furthermore, in the above-described embodiment, the case has been described where different LDPC encoded data is transmitted from two antennas upon the first transmission, and part of the LDPC encoded data is transmitted from one antenna upon retransmission, but the present invention is not limited to this.

Figure 14:
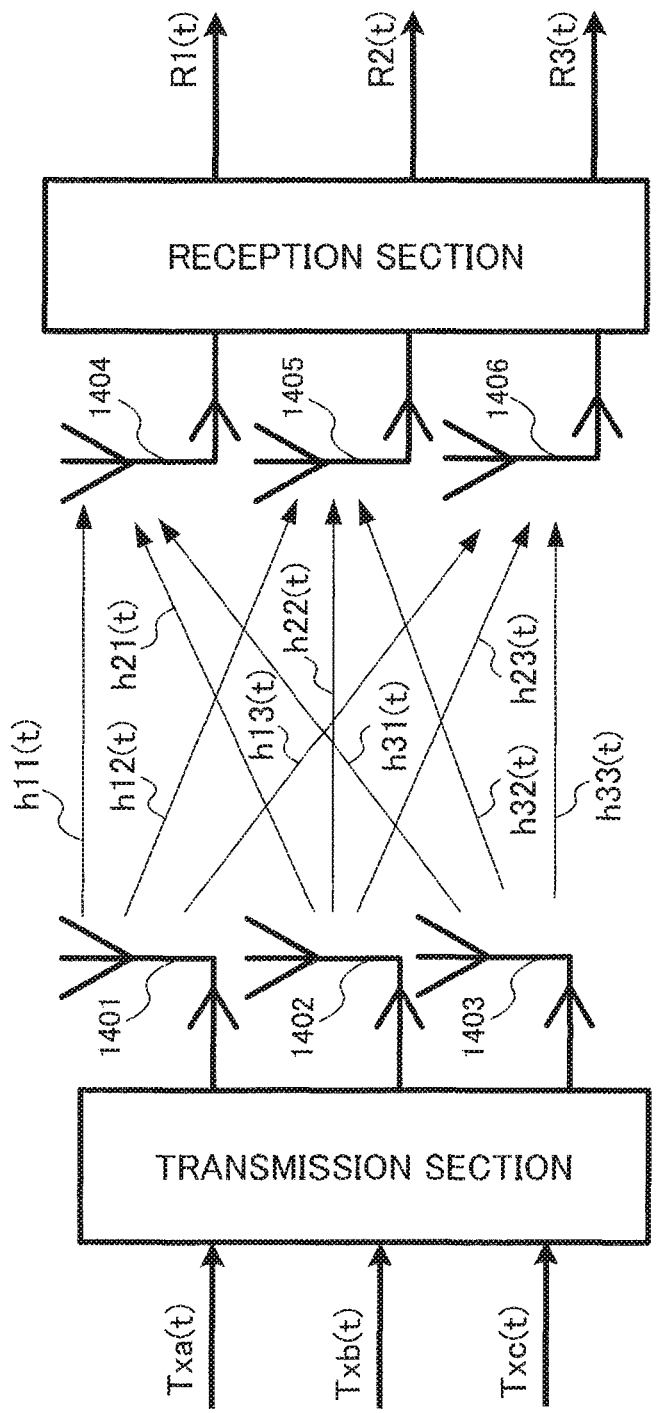
FIG. 14 shows an image of a multi-antenna communication system when there are three transmit antennas and three receive antennas.

For example, a case will be considered as an example where in a multi-antenna communication system using three transmit antennas (base station) and three receive antennas (terminal) as shown in FIG. 14, transmission signals Txa(t), Txb(t) and Txc(t) are transmitted from transmit antennas 1401, 1402 and 1403, respectively. At this time, when it is assumed that received signals received at receive antennas 1404, 1405 and 1406 are R1(t), R2(t) and R3(t), respectively, the following relational equation holds.

[3]

$$\begin{pmatrix} R1(t) \\ R2(t) \\ R3(t) \end{pmatrix} = \begin{pmatrix} h11(t) & h12(t) & h13(t) \\ h21(t) & h22(t) & h23(t) \\ h31(t) & h32(t) & h33(t) \end{pmatrix} \begin{pmatrix} Txa(t) \\ Txb(t) \\ Txc(t) \end{pmatrix} \quad \text{(Equation 3)}$$

The base station transmits data other than retransmission data using three transmit antennas. Here, when partial data is retransmitted, the partial data can be transmitted using a transmission method having a high diversity gain by applying space-time block codes and Cyclic Delay Diversity and moreover retransmitting the partial data with three antennas 1401, 1402 and 1403.

Figure 15:
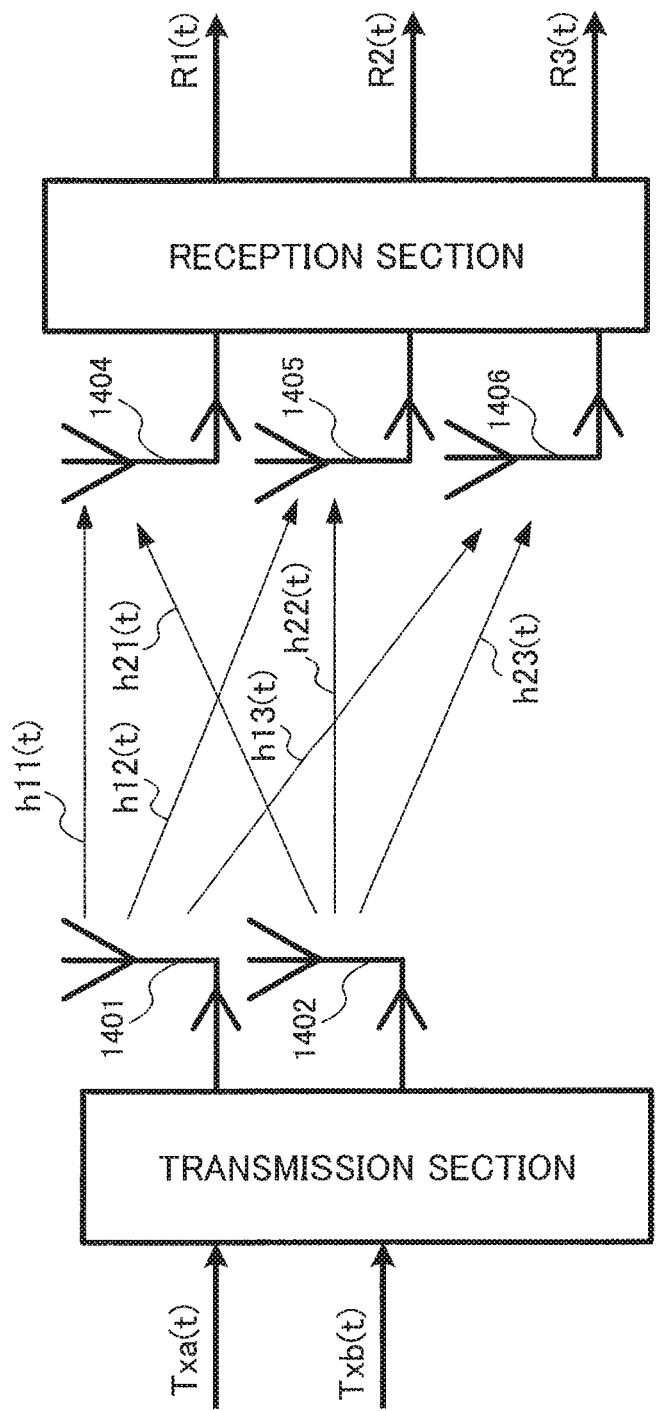
FIG. 15 shows an image of a multi-antenna communication system when there are two transmit antennas and three receive antennas.

As another method for transmitting partial data using a transmission method with a high diversity gain, there is a method of transmitting signals Txa and Txb as retransmission signals (partial data) using two transmit antennas 1401 and 1402 as shown in FIG. 15. In this way, the terminal can receive signals using three receive antennas 1404, 1405 and 1406, so that it is possible to obtain higher diversity gains than when transmission is not retransmission. In this way, the method of improving the diversity gain upon retransmission by reducing the number of transmit antennas has a merit of being more excellent than space-time block codes and Cyclic Delay Diversity in the data transmission speed. That is, by transmitting N lines of transmission signals through N transmit antennas when transmission is not retransmission, and transmitting retransmission data with M (M<N) lines of transmission signals through the M transmit antennas only upon retransmission, it is possible to obtain a high diversity gain upon retransmission without considerably reducing the data transmission speed.

Furthermore, in the above-described embodiment, the case has been described as an example where the present invention is applied to the radio communication system based on an OFDM scheme which is one of multicarrier schemes, but the present invention is not limited to this, and similar effects can also be obtained when the present invention is applied to a radio communication system based on a single carrier scheme or a radio communication scheme based on a spread spectrum scheme.

The present application is based on Japanese Patent Application No. 2004-340371, filed on Nov. 25, 2004, entire content of which is expressly incorporated by reference herein.

INDUSTRIAL APPLICABILITY

The present invention can be widely applied to a multi-antenna communication system which performs radio transmission using a plurality of antennas such as an OFDM-MIMO communication system.

The invention claimed is:
1. A reception apparatus comprising:
a receiver that receives a first reception sequence corresponding to a first encoded data sequence; and
a Low Density Parity Check (LDPC) decoder that obtains an estimated sequence of an information sequence by performing a decoding processing using the first reception sequence and a parity check matrix including a plurality of columns that are different in column weight, when the first encoded data sequence is an encoded data sequence generated by selecting from a second encoded data sequence based on column weights of the parity check matrix, the second encoded data sequence being encoded the information sequence using an encoding processing defined by the parity check matrix, wherein:

each of the column weights corresponding to the first encoded data sequence is equal to or greater than a maximum value of a column weight corresponding to a third encoded data sequence not selected from the second encoded data sequence, and a data length of the first encoded data sequence is shorter than a data length of the second encoded data sequence.

2. The reception apparatus according to claim 1, wherein:
the receiver further receives a third reception sequence corresponding to a fourth encoded data sequence after the receiver receives the first reception sequence; and
the LDPC decoder obtains the estimated sequence of the information sequence by performing the decoding processing using the parity check matrix and the third reception sequence, when the fourth encoded data sequence is an encoded data sequence corresponding to a same column as the column used for selecting the first encoded data sequence.

3. The reception apparatus according to claim 1, wherein:
the receiver further receives a fourth reception sequence corresponding to a fifth encoded data sequence after the receiver receives the first reception sequence; and
the LDPC decoder obtains the estimated sequence of the information sequence by performing the decoding processing using the parity check matrix and the fourth reception sequence, when the fifth encoded data sequence is an encoded data sequence corresponding to a different column from the column used for selecting the first encoded data sequence.

4. A reception method comprising:
receiving a first reception sequence corresponding to a first encoded data sequence; and
obtaining an estimated sequence of an information sequence by performing a decoding processing using the first reception sequence and a parity check matrix including a plurality of columns that are different in column weight, when the first encoded data sequence is an encoded data sequence generated by selecting from a second encoded data sequence based on column weights of the parity check matrix, the second encoded data sequence being encoded the information sequence using an encoding processing defined by the parity check matrix, wherein:

each of the column weights corresponding to the first encoded data sequence is equal to or greater than a maximum value of a column weight corresponding to a third encoded data sequence not selected from the second encoded data sequence, and a data length of the first encoded data sequence is shorter than a data length of the second encoded data sequence.

5. The reception method according to claim 4, further comprising:
receiving a third reception sequence corresponding to a fourth encoded data sequence after receiving the first reception sequence; and
obtaining the estimated sequence of the information sequence by performing the decoding processing using the parity check matrix and the third reception sequence, when the fourth encoded data sequence is an encoded data sequence corresponding to a same column as the column used for selecting the first encoded data sequence.

6. The reception method according to claim 4, further comprising:
receiving a fourth reception sequence corresponding to a fifth encoded data sequence after receiving the first reception sequence; and
obtaining the estimated sequence of the information sequence by performing the decoding processing using the parity check matrix and the fourth reception sequence, when the fifth encoded data sequence is an encoded data sequence corresponding to a different column from the column used for selecting the first encoded data sequence.

* * * * *